United States Patent [19]

Takamoro et al.

[11] Patent Number: 4,864,259
[45] Date of Patent: Sep. 5, 1989

[54] LADDER-TYPE ELECTRIC FILTER CIRCUIT APPARATUS

[75] Inventors: Kenji Takamoro; Kenji Mizoe, both of Tokyo; Tatsuo Ogawa; Yasuhiko Nakagawa, both of Nagoya, all of Japan

[73] Assignees: NGK Spark Plug Co., Ltd., Nagoya; NEC Corporation, Tokyo, both of Japan

[21] Appl. No.: 274,869

[22] Filed: Nov. 23, 1988

[30] Foreign Application Priority Data

Nov. 27, 1987 [JP]  Japan ............................ 62-181782[U]

[51] Int. Cl.[4] ........................ H03H 9/205; H03H 9/58
[52] U.S. Cl. .................................... 333/189; 310/348; 333/187
[58] Field of Search ................ 333/187, 189, 190–192; 310/348, 352, 365, 366, 325

[56] References Cited

U.S. PATENT DOCUMENTS 3,832,761  9/1974  Sheahan et al. ................ 333/189 X
4,353,045  10/1982  Matsui et al. ........................ 333/190
4,639,698  1/1987  Nishiki ............................... 333/187

Primary Examiner—Marvin L. Nussbaum
Attorney, Agent, or Firm—Larson and Taylor

[57] ABSTRACT

A ladder-type electric filter circuit apparatus having a plurality of thinner electric filter units wherein each electric filter unit includes a casing of metal into which piezoelectric resonator elements and terminal plates are inserted, and the metal casing is securely mounted on a printed circuit board by soldering. The piezoelectric resonator elements and terminal plates are insulated from the metal casing by an insulating plate and an elastic insulatiang plate which is also served as a vibration or shock absorber for protecting the contained filter from any external vibration or shock propagated through the printed circuit board.

7 Claims, 4 Drawing Sheets

LADDER-TYPE ELECTRIC FILTER CIRCUIT APPARATUS

BACKGROUND OF THE INVENTION

The present invention relates to a ladder-type electric filter circuit apparatus for filtering an intermediate frequency in a variety of radio equipments, in which it comprises a plurality of electric filter units each of which includes a plurality of piezoelectric resonator elements, a plurality of terminal plates and a casing for containing the resonator elements and the terminal plates.

There is a known ladder-type electric filter circuit apparatus in which a plurality of electric filter units as mentioned above are provided in a cascade configuration on a printed circuit board by means of soldering, and input and output terminal plates and an earth plate are respectively provided with protruded connecting legs which pass through associated ones of through holes bored in desired electrical conductive passage of the board. Each of the electric filter units generally comprises a plurality of piezoelectric resonator elements and a plurality of terminal plates, these resonator elements as well as the terminal being insulatingly and in cascade contained within a casing of synthetic resin.

An example of such a conventional electric filter arrangement is shown in FIG. 1. It comprises a box-shaped casing A of synthetic resin within which a plurality of piezoelectric resonator elements B and C and two terminal plates D are contained in a superimposed or stacked and electrically insulated condition. The piezoelectric resonator element B may be connected to a series branch of a ladder-type electric filter circuit and the piezoelectric resonator element C connected to a parallel branch of the ladder-type electric filter circuit. From the point of view of correctly maintaining shape and strength and executing molding, the casing A should be formed with at least about 0.3 mm in thickness. This in turn results in the increased thickness of the electric filter units and thus the increased size of a filter circuit arrangement constructed by such electric filter units.

Further, since the casing A is made from synthetic resin material which rejects a connecting means such as a soldering means, the electric filter assemblies are supported merely by the connection of the connecting legs of the respective terminal plates D in each filter assembly with the printed circuit board, thus eventually weakening the connecting strength and resulting in the unstable mounting.

Another examples of the conventional electric filter arrangement having the casing of synthetic resin are disclosed in U.S. Pat. Nos. 4,353,045 and 4,323,865.

Recently, there is an increasing demand for materializing smaller and thinner dimensions of the radio equipment incorporating such a filter circuit apparatus. These circumstances have been constituted competition in production of thiner filter circuit arrangements having a thickness of 3 mm at maximum. However, since the conventional filter arrangements heretofore proposed have usually a height of about 7 mm, they can not fully satisfy the demamd mentioned above. It has been also attempted to decrease the height of the filter arrangement by mounting it on the printed circuit board by means of a face-contacting, but this has not yet been attended with a desired result.

SUMMARY OF THE INVENTION

It is therefore an object of the present invention to provide a ladder-type electric filter circuit apparatus capable of covercoming the problems or disadvantages of the conventional filter arrangements, reducing the dimensions of the filter assemblies and being securely mounted on a printed circuit board.

Another object of the present invention is to provide a miniaturized ladder-type electric filter circuit apparatus which fully meets with the requirements for smaller and thinner dimensions of the radio equipment.

According to the present invention, there is provided a ladder-type electric filter circuit apparatus comprising a plurality of electric filter units each of which includes a plurality of piezoelectric resonator elements, an input and output terminal plates for electrically connecting said piezoelectric resonator elements to form a predetermined connection type filter circuit and mechanically supporting said piezoelectric resonator elements and a metal casing for containing said piezoelectric resonator elements, said input terminal plated and said output terminal plate in a superimposed configuration, said input terminal plate and said output terminal plate being respectively provided with connecting legs, said metal casing being provided with at least one connecting leg, said electric filter units being securly mounted on a printed circuit board in such a manner that the metal casing of each of said electric filter units is contacted with said printed circuit board at its one outer surface, and said connecting legs protruded from said each electric filter unit being cascaded by soldering the connecting legs on electrical conductive paths printed on said printed circuit board.

The connecting legs of said input terminal plate, said output terminal plate and said metal casing may preferably be extended in the same direction.

It is preferable that the predetermined connection type filter circuit is of L-connection type which comprises one series piezoelectric resonator element connected to form a series branch and one parallel piezoelectric resonator element connected to form a parallel branch.

Alternatively, the filter unit may be T-connection type having two series piezoelectric resonator elements and one parallel piezoelectric resonator element, or π-connection type having one series piezoelectric resonator element and two parallel piezoelectric resonator elements.

It is appreciated that a filtering characteristic of the thus constructed electric filter circuit apparatus can optionally be determined by selecting the number of the filter units to be provided on the printed circuit board.

With the filter circuit apparatus of the present invention, the wall thickness of the metal casing in each filter unit can be decreased without losing sufficient strength. As a result, total height of the electric filter circuit apparatus can substantially be minimized by employing the metal casing which is compatible with a soldering procedure and thus can firmly be soldered to the printed circuit board.

In order to avoid any short-circuiting between the metal casing and the components contained therein, an insulation material should be provided therebetween except for the terminal plates. In this context, it will be understood that since the insulation should be provided between the periphery of the contained components and the inner surface of the metal casing, this does not cause the total thickness or height of the respective units to increase.

The present invention will now be described by way of examples with reference to the accompanying drawings:

p DETAILED DESCRIPTION

Referring to FIGS. 2 to 6, there is shown a ladder-type electric filter circuit apparatus according to an embodiment of the present invention.

Figure 1:
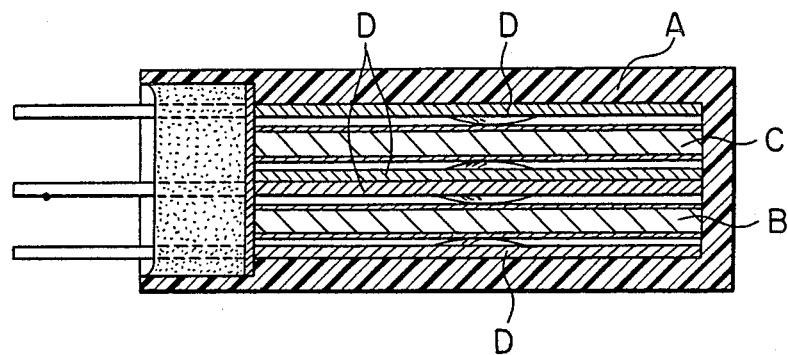
FIG. 1 is a longitudinal section schematically showing a conventional electric filter circuit arrangement.
Figure 2:
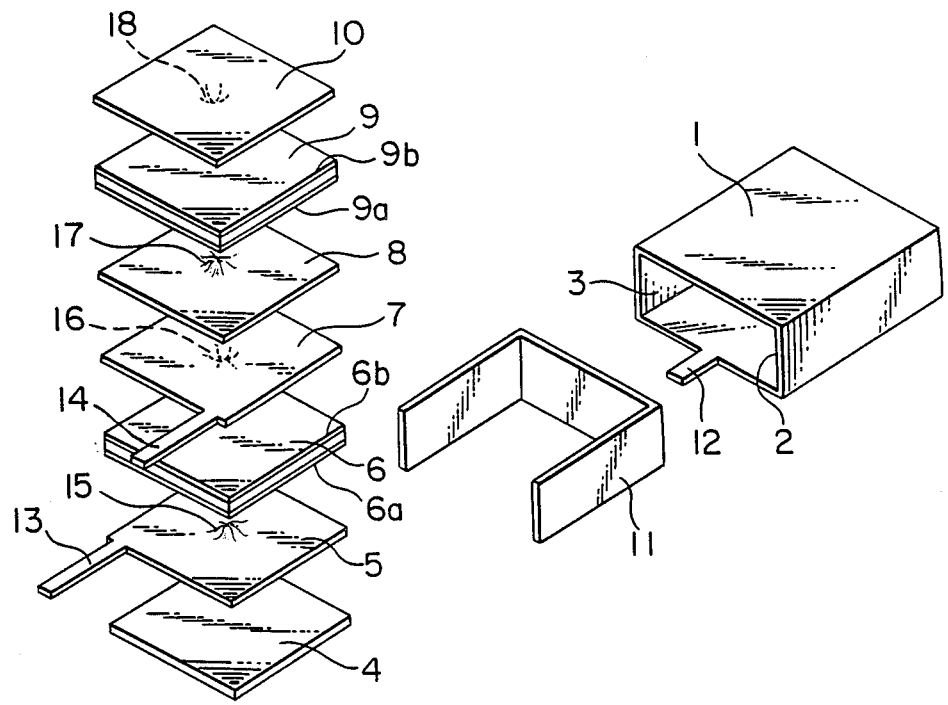
FIG. 2 is an exploded perspective view of one filter unit of an electric filter circuit apparatus according to the present invention.
Figure 3:
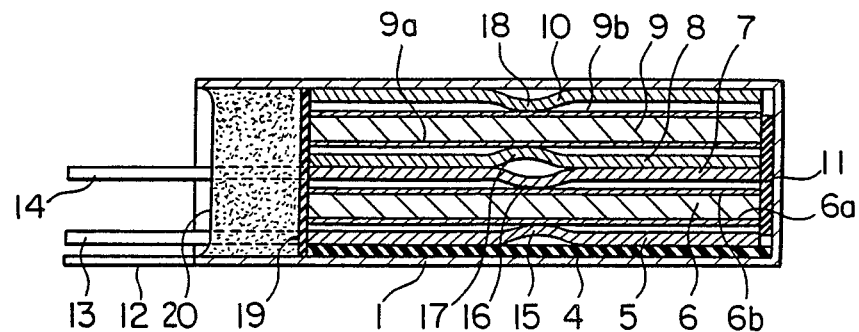
FIG. 3 is a schematic longitudinal section showing the assembled electric filter unit.

The reference numeral 1 represents a thin casing of a box-shape which has an opening 2 at one side portion and an inner space 3. The casing 1 is made of metal such as nickel silver or the like which is capable of soldering. The wall of the metal casing 1 has about 0.15 mm in thickness, for example. As shown in FIGS. 2 and 3, a filter assembly is inserted into the inner spaced 3 through the opening 2. The filter assembly comprises an elastic insulating plate 4 of rubber material, an input terminal plate 5, a first piezoelectric resonator element 6 being connected to form series branch of a filter circuit, an output terminal plate 7, an intermediate terminal plate 8, a second piezoelectric resonator element 9 being adapted to form parallel branch of the filter circuit, and an earth terminal plate 10. These components may sequentially be inserted into the space 3 of the metal casing 1 through the opening 2. The reference numeral 11 represents U-shaped insulating plate which is disposed in the space 3 of the casing 1 so that it surrounds both sides and the rear side of the input terminal plate 5, the first piezoelectric resonator element 6, the output terminal plate 7, the intermediate terminal plate 8 and the second piezoelectric resonator element 9, thereby, together with the insulating plate 4 disposed between the metal casing 1 and the input terminal plate 5, electrically insulating these components from the inner wall surface of the metal casing 1.

The metal casing 1, the input terminal plate 5 and the output terminal plate 7 are respectively provided with connecting terminals 12, 13 and 14 which are extending outward and are positioned not to be superimposed to each other. The input terminal plate 5, the output terminal plate 7, the intermediate terminal plate 8 and the earth terminal plate 10 are respectively provided with circular arc-shaped protuberant portions 15, 16, 17 and 18 which are positioned so that each protuberant portion abuts on the associated vibrating node of the piezoelectric resonator elements 6 and 9 when being assembled. Therefore, these protuberant portions 15 to 18 are served to electrically and mechanically support the first and second piezoelectric resonator elements 6 and 9. Upon assembling of the filter unit, as shown in FIG. 3, one electrode 6a of the first piezoelectric resonator element 6 is connected to the input terminal plate 5 through the protuberant portion 15 integrally provided thereon, and the other electrode 6b of the first resonator element 6 is connected to the output terminal plate 7 through the protuberant portion 16 integrally provided thereon. Similarly, one electrode 9a of the second piezoelectric resonator element 9 is connected to the intermediate terminal plate 8 through the protuberant portion 17 integrally provided thereon, and the other electrode 9b of the second resonator element 9 to the earth terminal plate 10 through the protuberant portion 18 integrally provided thereon. The output terminal plate 7 and the intermediate terminal plate 8 are contacted to each other, and thus the other electrode 6b of the first resonator element 6 is electrically connected to the one electrode 9a of the second resonator element 9 through these terminal plates. The other electrode 9b of the second resonator element 9 is grounded to the metal casing 1 through the earth terminal plate 10.

After the stacked filter components 4 to 11 are inserted into the metal casing 1, as shown in FIG. 3, a cover plate 19 is fitted into the opening 2 of the metal casing 1 by insertion of the connecting terminals 13 and 14 of the input and output terminal plates 5 and 7 through the cover plate before a filler 20 such as epoxy resin is eventually applied into the opening 2. Then the input and output connecting terminals 13 and 14 are cranked in the direction of the earth connecting terminal 12 so that these terminals are juxtaposed in the plane of the base surface of the metal casing 1.

Figure 4:
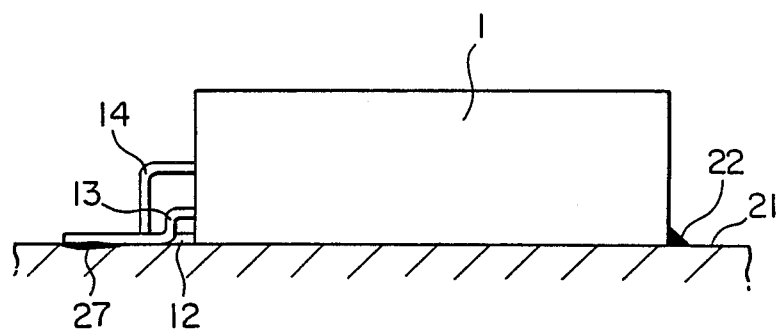
FIG. 4 is a schematic sectional view showing the electric filter unit when being mounted on a printed circuit board.
Figure 5:
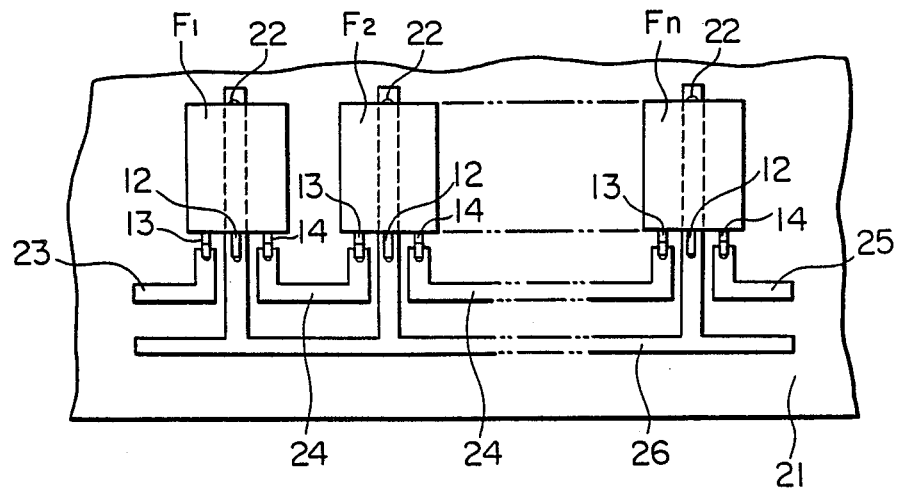
FIG. 5 is a partial plan view showing the electric filter circuit apparatus.

In this way, a plurality of such filter units generally designated by F1, F2—Fn in FIG. 5 are prepared. These filter units F1 to Fn are juxtaposedly mounted on a printed circuit board 21 as shown in FIGS. 4 and 5, and are securely fixed on the surface of the board 21 by soldering generally designated by the reference numeral 22 which is applied to each of the external surfaces of the respective metal casings. Furthermore, the connecting terminals 12, 13 and 14 extended from the opening 2 of each metal casing 1 are respectively connected to predetermined conductive lines 23, 24, 25 and 26 provided on the board 21 by means of soldering generally designated by the reference numeral 27 as shown in FIG. 5.

More particularly, the input connecting terminal 13 of the first stage filter unit F1 is connected to the input line 23, and the output connecting terminal 14 of final stage filter unit Fn is connected to the output line 25. The output and input terminals 14 and 13 of the adjacent filter units are connected to each other via the associated conductive line 24 so that all the filter units are cascaded through the conductive lines 24. The earth terminals 12 of the respective filter units are commonly connected to the earth line 26.

Figure 6:
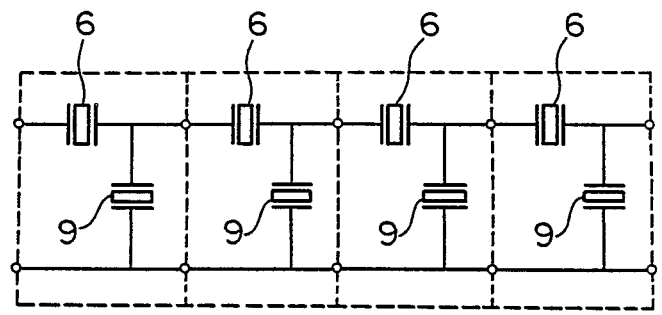
FIG. 6 is an equivalent circuit diagram of the electric filter circuit apparatus having four L-connection type filter units.

FIG. 6 shows an equivalent circuit diagram of the ladder-type electric filter circuit apparatus comprising four filter units as constructed in accordance with the illustrated embodiment.

Since each of the filter units is arranged on the printed circuit board 21 in such a manner that the elastic insulating plate 4 in each filter unit lies in the lower side, that is, to face the bottom, it is possible to cause the elastic insulating plate to effectively absorb any external vibration or shock which may be propagated through the printed circuit board 21 into the filter units and may adversely affect the filter units. This can certainly improve the reliability of the filter circuit apparatus.

Figure 7:
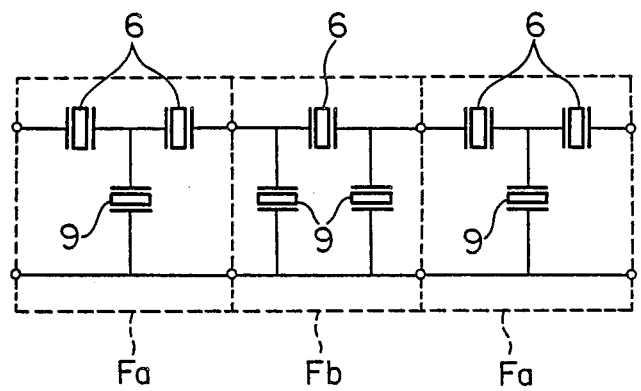
FIG. 7 is an equivalent circuit diagram of an electric filter circuit apparatus constructed by two T-connection type filter units and one π-connection type filter unit.

The above description has merely referred to an example of L-connection type electric filter units each being composed of a single piezoelectric resonator element 6 branched in series and a single piezoelectric resonator element 9 branched in parallel and providing an essential filter circuit. However, the preferred embodiment allows three piezoelectric resonator elements at its maximum to be stacked in the same metal casing while total height (thickness) of each filter unit is limited to less than 3 mm. As a result, it is also possible to provide T-connection type filter unit comprising two piezoelectric resonator elements for series branch and one piezoelectric resonator element for parallel branch, and π-connection type filter unit comprising one piezoelectric resonator element for series branch and two piezo-electric resonator elements for parallel branch. FIG. 7 shows an equivalent circuit diagram of a ladder-type electric filter circuit apparatus including two T-connection type filter units Fa and one π-connection type filter unit Fb which are mounted on a common printed circuit board as in the case of FIGS. 4 and 5.

As described above, the present invention introduces a conductive thin-metal casing for containing a filter assembly. This can substantially decreases the total height of the filter unit as compared with the conventional filter circuit arrangements, thus contributing to miniaturization of a filter circuit apparatus.

The provision of the metal casing permits it to be bonded the surface of the printed circuit board by means of soldering, thereby obtaining a steady supporting for the filter unit(s).

It is to be understood that the above-mentioned embodiments are only illustrative of the application of the principles of the present invention. Numerous modifications and alterations may be made by those skilled in the art without departing from the spirit and scope of the invention, and the appended claims are intended to cover such modifications and alterations.

What is claimed is:

1. A ladder-type electric filter circuit apparatus comprising a plurality of electric filter units each of which incudes a plurality of piezoelectric resonator elements, an input and output terminal plates for electrically connecting said piezoelectric resonator elements to form a predetermined connection type filter circuit and mechanically supporting said piezoelectric resonator elements and a metal casing for containing said piezoelectric resonator elements, said input terminal plate and said output terminal plate in a superimposed configuration, said input terminal plate and said output terminal plate being respectively provided with an input and output connecting legs, said metal casing being provided with at least one connecting leg, said electric filter units being securly mounted on a printed circuit board in such a manner that the metal casing of each of said electric filter units is contacted with said printed circuit board at its one outer surface, and said connecting legs protruded from said each electric filter unit being cascaded by soldering the connecting legs on electrical conductive paths printed on said printed circuit board 2. A ladder-type electric filter circuit apparatus as claimed in claim 1, wherein said connecting legs of the input terminal plate, the output terminal plate and the metal casing are extended in the same direction.

3. A ladder-type electric filter circuit apparatus as claimed in claim 1, wherein said each filter unit is of L-connection type which comprises one series piezoelectric resonator element connected to form a series branch and one parallel piezoelectric resonator element connected to form a parallel branch.

4. A ladder-type electric filter circuit apparatus as claimed in claim 1, wherein said each filter unit is T-connection type having two series piezoelectric resonator elements for the series branch and one parallel piezoelectric resonator element for the parallel branch.

5. A ladder-type electric filter circuit apparatus as claimed in claim 1, wherein said each filter unit is π-connection type having one series piezoelectric resonator element for the series branch and two parallel piezoelectric resonator elements for the parallel branch.

6. A ladder-type electric filter circuit apparatus as claimed in claim 1, wherein said piezoelectric resonator elements and terminal plates are insulated from the metal casing by an insulating plate and an elastic insulating plate.

7. A ladder-type electric filter circuit apparatus as claimed in claim 1, wherein said each metal casing is made of easily-solderable material such as nickel silver.

* * * * *